US010276770B2

(12) United States Patent
Lee et al.

(10) Patent No.: US 10,276,770 B2
(45) Date of Patent: Apr. 30, 2019

(54) FLEXIBLE THERMOELECTRIC ELEMENT AND METHOD FOR MANUFACTURING THE SAME

(71) Applicant: Hyundai Motor Company, Seoul (KR)

(72) Inventors: Eun Yeong Lee, Seoul (KR); Sung Geun Park, Seoul (KR); Sang Hak Kim, Seoul (KR); Mi Yeon Song, Seoul (KR)

(73) Assignee: Hyundai Motor Company, Seoul (KR)

( * ) Notice: Subject to any disclaimer, the term of this patent is extended or adjusted under 35 U.S.C. 154(b) by 108 days.

(21) Appl. No.: 15/341,024

(22) Filed: Nov. 2, 2016

(65) Prior Publication Data

US 2017/0271571 A1    Sep. 21, 2017

(30) Foreign Application Priority Data

Mar. 18, 2016   (KR) .................... 10-2016-0032734

(51) Int. Cl.
*H01L 35/32*    (2006.01)
*H01L 35/34*    (2006.01)

(52) U.S. Cl.
CPC .............. *H01L 35/32* (2013.01); *H01L 35/34* (2013.01)

(58) Field of Classification Search
CPC ................................ H01L 35/32; H01L 35/34
See application file for complete search history.

(56) References Cited

U.S. PATENT DOCUMENTS

| 5,022,928 A * | 6/1991 | Buist ............. F25B 21/02 136/206 |
| 2005/0121065 A1* | 6/2005 | Otey .............. H01L 35/30 136/205 |
| 2010/0205920 A1* | 8/2010 | Czubarow ....... C04B 35/62259 55/523 |
| 2013/0312806 A1 | 11/2013 | Carroll |
| 2017/0018699 A1 | 1/2017 | Lee et al. |
| 2018/0190892 A1* | 7/2018 | Imai ............... H01L 35/32 |

FOREIGN PATENT DOCUMENTS

| JP | 2001-217469 A | 8/2001 |
| KR | 2010-0024028 A | 3/2010 |
| KR | 10-1346568 B1 | 1/2014 |
| KR | 10-1351683 B1 | 1/2014 |
| KR | 10-1373126 B1 | 3/2014 |
| KR | 10-2017-0008509 A | 1/2017 |

\* cited by examiner

*Primary Examiner* — Jayne L Mershon
(74) *Attorney, Agent, or Firm* — Mintz Levin Cohn Ferris Glovsky and Popeo, P.C.; Peter F. Corless

(57) ABSTRACT

A flexible thermoelectric element and a method for manufacturing the same is provided. The thermoelectric element is disposed between a high temperature portion and a low temperature portion and includes a plurality of p-type materials and n-type materials formed at a predetermined interval and is folded at sections of the p-type materials and sections of the n-type materials to form folding components. An insulating filler is coated between the p-type materials and the n-type materials that are folded. A module is formed by folding the flexible thermoelectric element, and separate cutting and alignment of the thermoelectric element are omitted at portions that contact with the high and low temperature portions.

9 Claims, 5 Drawing Sheets

FLEXIBLE THERMOELECTRIC ELEMENT AND METHOD FOR MANUFACTURING THE SAME

CROSS-REFERENCE TO RELATED APPLICATION

This application is based on and claims the benefit of priority to Korean Patent Application No. 10-2016-0032734, filed on Mar. 18, 2016 in the Korean Intellectual Property Office, the disclosure of which is incorporated herein in its entirety by reference.

TECHNICAL FIELD

The present disclosure relates to a flexible thermoelectric element and a method for manufacturing the same, and more particularly, to an improvement of a processing property and a reduction of contact resistance at portions that contact a high temperature portion and a low temperature portion by folding a flexible thermoelectric element including a p-type material and an n-type material to form a module.

BACKGROUND

Generally, a thermoelectric element based on an organic material is formed in a film type, and has a thickness from tens of nanometers to tens of micrometers. Further, the thermoelectric element has excellent thermoelectric performance in an in-plane direction, and generates electricity when a temperature gradient is provided in an in-plane direction of a film. Since the thermoelectric element has a thin thickness in an out-of-plane direction, a thermal equilibrium is implemented and the temperature gradient does not occur. Accordingly, generation of electricity is difficult for the thermoelectric element.

In the thermoelectric element according to the related art, as illustrated in FIG. 1, to implement electricity generation of a high output in an actual system, thermoelectric elements 30 should be repeatedly disposed at high density between a high temperature portion 10 and a low temperature portion 20. For example, elements are electrically connected in series with each other by alternately disposing n-type and p-type thermoelectric elements.

However, according to the related art, since an electrode 50 that connects the respective thermoelectric elements as well as a bonding material 40 are formed between the thermoelectric elements, and the high temperature portion and the low temperature portion, electrode interface resistance occurs in a current flowing passage, electric resistance is increased or power is rapidly decreased during of an interface separation or a crack occurrence by thermal shock, or the like, thereby causing a failure. Further, when the film having the thickness of about tens of micrometers to about tens of nanometers is removed to be aligned and the respective films are in contact with each other, greater loss occurs in the processing property and costs increase. Accordingly, the film may be made having a thickness of about 100 micrometers in a vertical direction based on a configuration of the thermoelectric element, and process loss increases even though the film is positioned upright in the vertical direction.

SUMMARY

The present disclosure provides a flexible thermoelectric element and a method for manufacturing the same. Specifically, a flexible thermoelectric element and a method for manufacturing the same may improve the processing property and reduce contact resistance at portions that contact a high temperature portion and a low temperature portion. For example, a flexible thermoelectric element that may include a p-type material and an n-type material may be configured to fold to form a module.

According to an exemplary embodiment of the present disclosure, a flexible thermoelectric element may include the thermoelectric element disposed between a high temperature portion and a low temperature portion. The thermoelectric element may have a plurality of p-type materials and n-type materials formed at a predetermined interval and may be folded at sections of the p-type materials and sections of the n-type materials to form folding components. Further, an insulating filler may be coated between the p-type materials and the n-type materials which are folded.

A bonding material connecting the high temperature portion and the thermoelectric element configured to transfer heat may be formed between the high temperature portion and the folding components of the thermoelectric element. A bonding material that connects the low temperature portion and the thermoelectric element to allow a heat transfer may be formed between the low temperature portion and the folding components of the thermoelectric element. A plurality of bonding materials may be formed at each of the folding components of the thermoelectric element. The insulating filler may be formed of a glass-based material, a ceramic-based material, a rubber-based material, and a polymer-based material. The bonding material may be formed of an epoxy and ceramic-based insulating bonding substance.

According to another exemplary embodiment of the present disclosure, a flexible thermoelectric element may include a plurality of insulating fillers formed to be spaced apart from each other by a predetermined interval on a high temperature portion and a low temperature portion. Further, the thermoelectric element may be formed integrally in the horizontal direction to include a plurality of p-type materials and n-type materials at a predetermined interval between the high temperature portion and the low temperature portion. In particular, the thermoelectric element may be disposed between the insulating fillers when the high temperature portion and the low temperature portion are pressurized.

According to another exemplary embodiment of the present disclosure, a method for manufacturing a flexible thermoelectric element may include bending the thermoelectric element having a ribbon type flexible structure including a p-type and an n-type. A solvent treatment may be performed for a portion of the bent thermoelectric element to integrally form a section of a p-type material and a section of an n-type material. The thermoelectric element may be planarized with the integrally formed section of the p-type material and the section of the n-type material. An insulating filler may be partially coated between the p-type material and the n-type material of the planarized thermoelectric element. The coated thermoelectric element coated may be folded at the section of the p-type material and the section of the n-type material. The folded thermoelectric element may be disposed between a high temperature portion and a low temperature portion.

Further, the insulating filler may be formed on a surface of the p-type material and the a surface of the n-type material. The insulating filler may be formed of a glass-based material, a ceramic-based material, a rubber-based material, and a polymer-based material. A bonding material, configured to provide a heat transfer passage, may be formed between the folded thermoelectric element, and the high temperature portion and the low temperature portion. The bonding material may be formed of an epoxy and ceramic-based insulating bonding substance.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
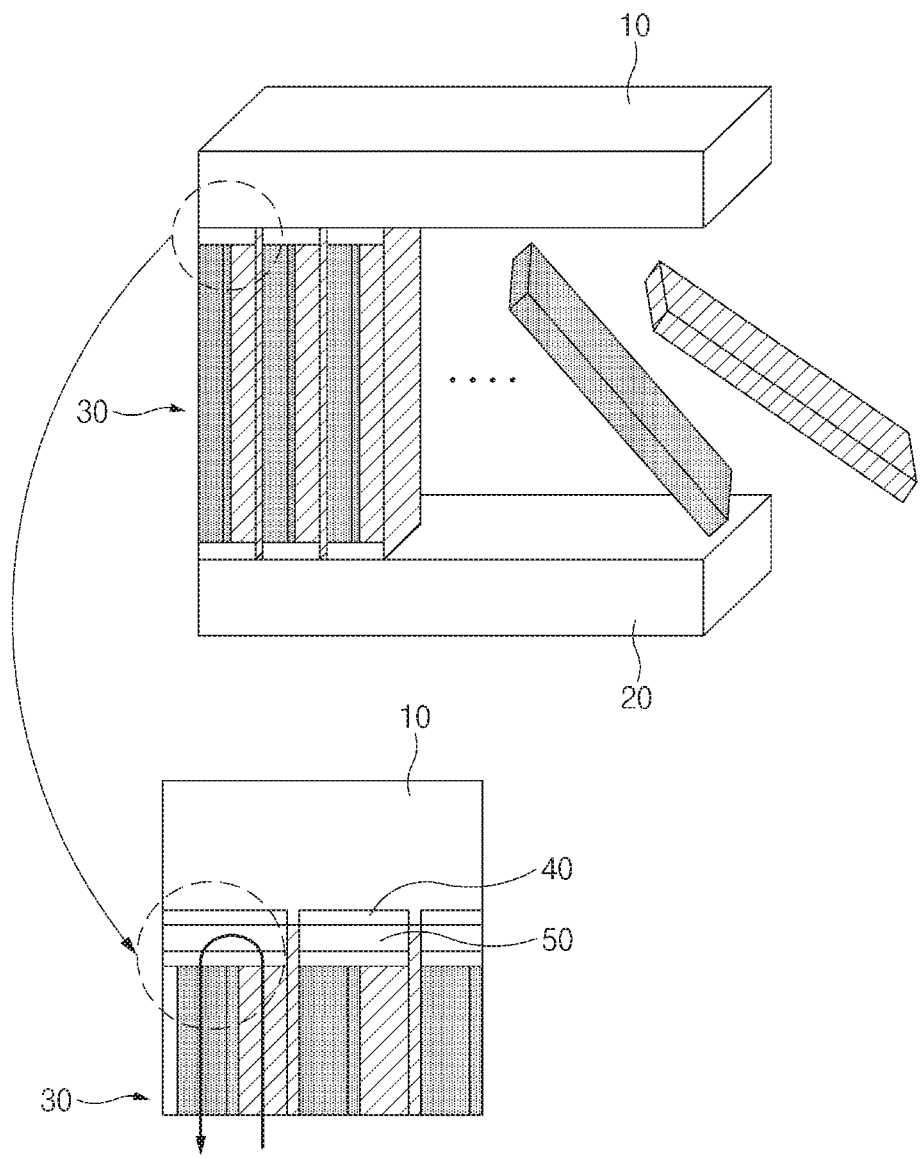
FIG. 1 is an exemplary cross-sectional view illustrating a thermoelectric element according to the related art.

Hereinafter, exemplary embodiments of the present disclosure will be described in detail with reference to the accompanying drawings. It is to be noted that in giving reference numerals to components of each of the accompanying drawings, the same components will be denoted by the same reference numerals even though they are shown in different drawings. Further, in describing exemplary embodiments of the present disclosure, well-known constructions or functions will not be described in detail in the case in which they may unnecessarily obscure the understanding of the exemplary embodiments of the present disclosure.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Figure 2:
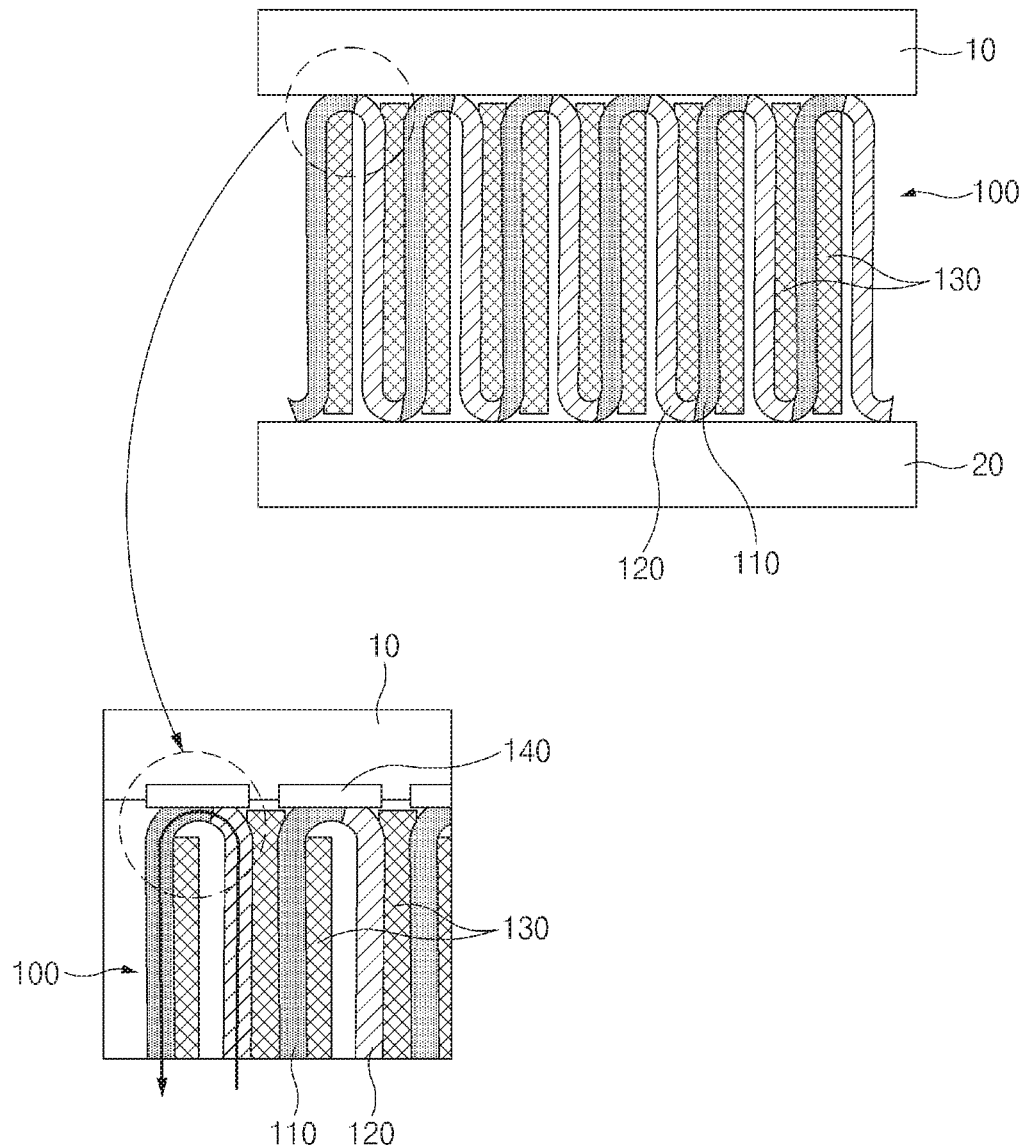
FIG. 2 is an exemplary cross-sectional view illustrating a flexible thermoelectric element according to an exemplary embodiment of the present disclosure.
Figure 3:
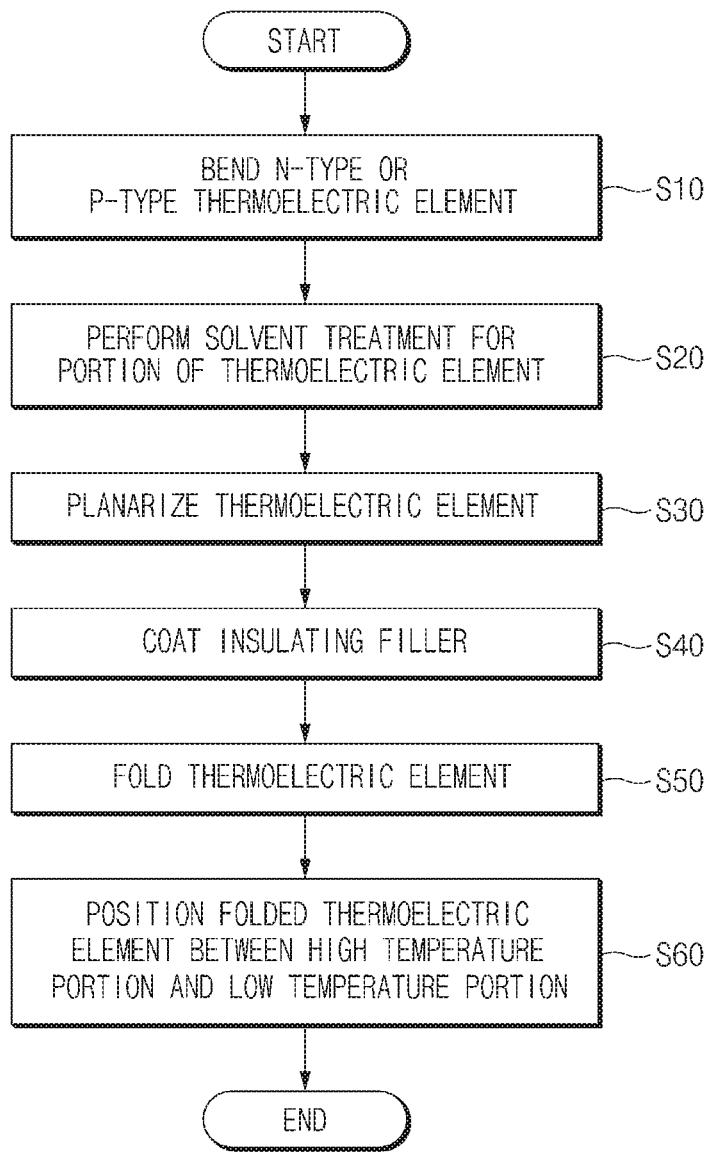
FIG. 3 is an exemplary flow chart illustrating a method for manufacturing a flexible thermoelectric element according to an exemplary embodiment of the present disclosure.
Figure 4:
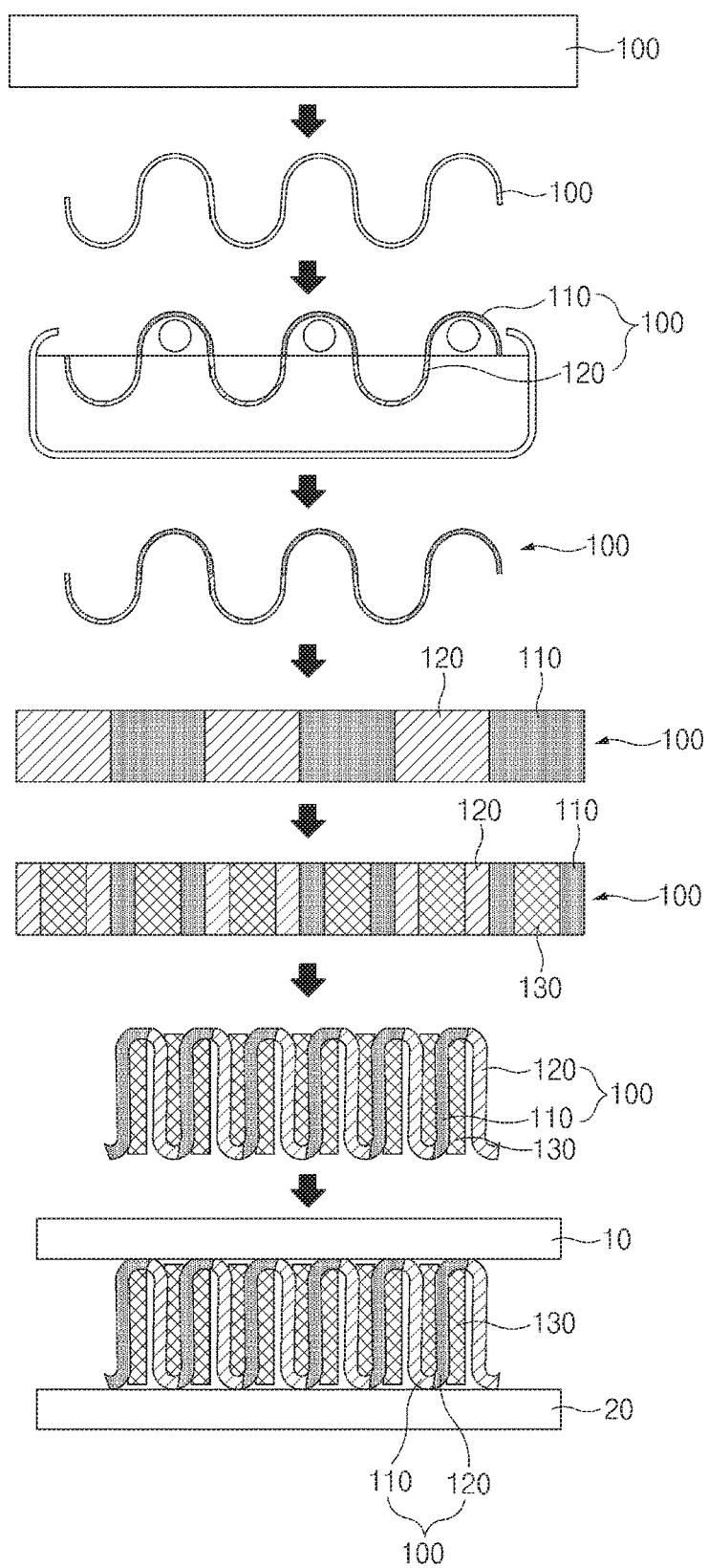
FIG. 4 is an exemplary view illustrating a process of forming a thermoelectric element in the method for manufacturing a flexible thermoelectric element according to an exemplary embodiment of the present disclosure.

A flexible thermoelectric element according to the present disclosure may include a thermoelectric element 100 disposed between a high temperature portion 10 and a low temperature portion 20 configured to fold to include a section of a p-type material 110 and a section of an n-type material 120. An an insulating filler 130 may be coated between the folded sections, as illustrated in FIG. 2. The thermoelectric element 100 may be formed in a flexible ribbon structure and may be formed between the high temperature portion 10 and the low temperature portion 20, which are a heat source structure. For example, the thermoelectric element 100 may include a plurality of p-type materials 110 and n-type materials 120 formed at a predetermined interval, and may be folded in the sections of the p-type materials 110 and the sections of the n-type materials 120, to form a plurality of folding components.

Further, the insulating filler 130 having low thermal conductivity may be coated between the p-type material 110 and the n-type material 120 folded, to insulate the p-type material 110 and the n-type material 120 of the thermoelectric element 100. The insulating filler 130 may be formed of a glass-based material, a ceramic-based material, a rubber-based material, and a polymer-based material.

Moreover, the bonding material 140 may be disposed or coated between the high temperature portion 10 and the folding component of the thermoelectric element 100 to connect the high temperature portion 10 and the thermoelectric element 100 to each other and may form a thermal transfer passage to provide a thermal transfer. Further, the bonding material 140 may be formed between the low temperature portion 20 and the folding component of the thermoelectric element 100 to connect the low temperature portion 20 and the thermoelectric element 100 to each other and may be configured to provide the thermal transfer. In other words, a plurality of bonding materials 140 may be formed to be provided to each of the folding components of the thermoelectric element 100. Additionally, the bonding material 140 may be formed of an epoxy and ceramic-based insulating bonding substance.

Figure 5:
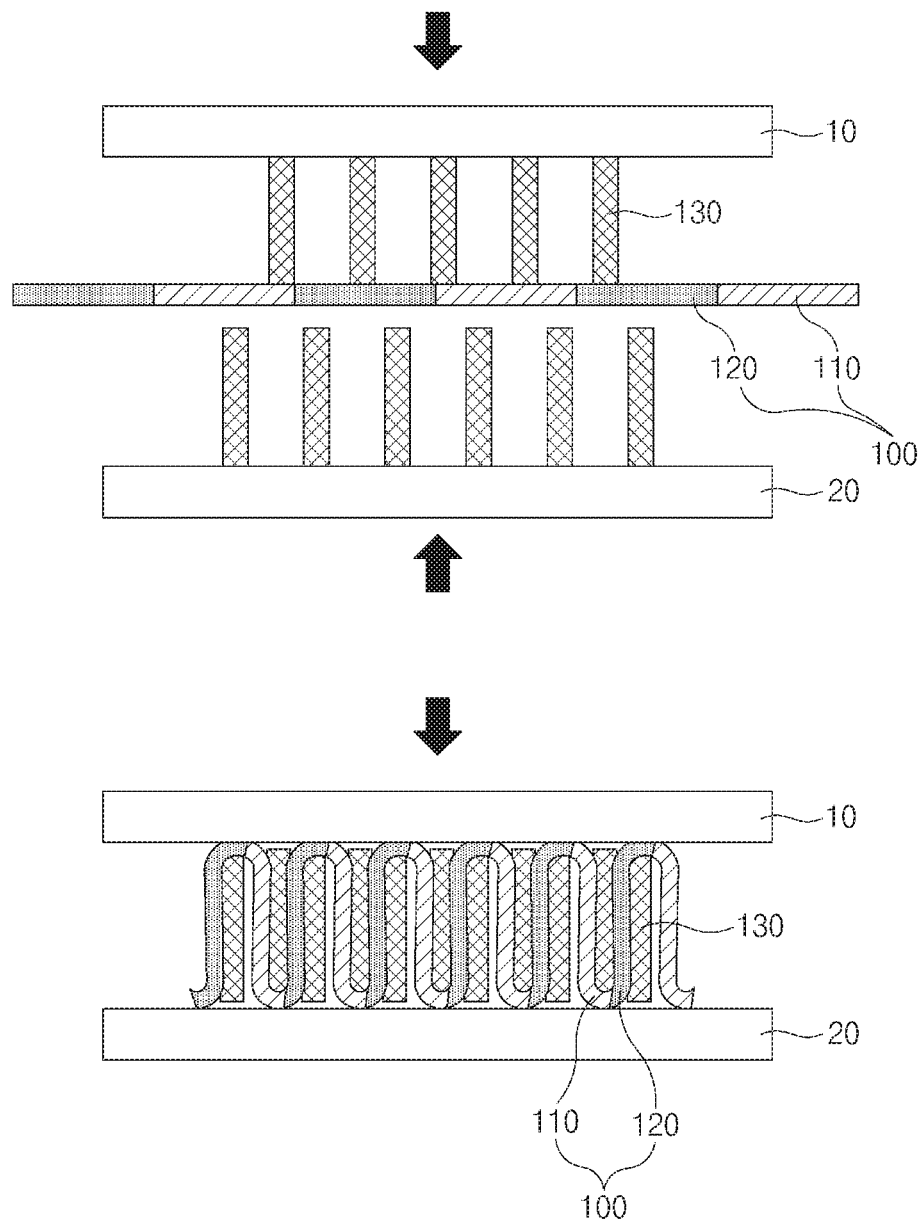
FIG. 5 is an exemplary view illustrating another example of the process of forming a thermoelectric element in the method for manufacturing a flexible thermoelectric element according to an exemplary embodiment of the present disclosure.

Furthermore, according to the present disclosure, as illustrated in FIG. 5, when a plurality of insulating fillers 130 are formed to be spaced apart from each other by a predetermined interval on the high temperature portion 10 and the low temperature portion 20, the thermoelectric element 100 may be integrally horizontally formed between the high temperature portion 10 and the low temperature portion 20 to include a plurality of p-type materials 110 and n-type materials 120 at a predetermined interval. Accordingly, the thermoelectric element 100 may be inserted between the insulating fillers 130 when external force is applied to the high temperature portion 10 and the low temperature portion 20.

In other words, the flexible thermoelectric element may also be formed by a method of pressurizing a planarized thermoelectric element 100 to integrally include the p-type materials 110 and the n-type materials 120. For example, the planarized thermoelectric element may be inserted between the insulating fillers 130 formed on the high temperature portion 10 and the low temperature portion 20 to be inserted between the insulating fillers 130 when the insulating fillers 130 are formed to be spaced apart from each other by the predetermined interval on the high temperature portion 10 and the low temperature portion 20, which are the heat source structure.

According to the present disclosure, when the thermoelectric element 100 is disposed between the high temperature portion 10 and the low temperature portion 20, the thermoelectric element 100 may include the plurality of p-type materials 110 and n-type materials 120 formed at the predetermined interval, and may be folded in the sections of the p-type materials 110 and the sections of the n-type materials 120 to form the folding component. The insulating fillers 130 may be coated between the p-type materials 110 and the n-type materials 120 which are folded, and the bonding materials 140 may be formed between the thermoelectric element 100, and the high temperature portion 10 and the low temperature portion 20. For example, the thermoelectric element 100 may be connected with the high temperature portion 10 and the low temperature portion 20 to transfer heat and configured to simultaneously transfer a current through the thermoelectric element 100. Accordingly, when an interface abnormality occurs, the heat transfer may be possible and an electric flow may not be influenced.

A method for manufacturing a flexible thermoelectric element according to the present disclosure may include bending a p-type or n-type thermoelectric element 100 (S10), performing a solvent treatment (S20), for a portion of the thermoelectric element 100 to form a section of a p-type material 110 and a section of an n-type material 120, planarizing the thermoelectric element 100 (S30), partially coating an insulating filler 130 between the p-type material 110 and the n-type material 120 (S40), folding the thermoelectric element 100 (S50), and providing the folded thermoelectric element 100 between a high temperature portion 10 and a low temperature portion 20 (S60). Additionally, the contents related to the flexible thermoelectric element refer to FIG. 2.

The thermoelectric element 100 having a ribbon type flexible structure including a p-type and an n-type may be bent to form bends at a plurality of sections (S10). A portion of the bent thermoelectric element 100 may be immersed in a solvent treatment solution to change a type to deform a material of the portion immersed in the solvent treatment solution by a solvent treatment (S20). Accordingly, a section of a p-type material 110 and a section of an n-type material 120 to may be formed integrally. The thermoelectric element 100 having the section of the p-type material 110 and the section of the n-type material 120 integrally formed (S20) may be planarized (S30).

An insulating filler 130 may be partially coated between the p-type material 110 and the n-type material 120 of the planarized thermoelectric element 100 planarized (S40). In particular, the insulating filler 130 may be formed on a surface of the p-type material 110 and a surface of the n-type material (S40), to insulate the p-type material 110 and the n-type material 120 of the thermoelectric element 100 when the thermoelectric element 100 is folded (S50) to be described below. Moreover, the insulating filler 130 may be formed of a glass-based material, a ceramic-based material, a rubber-based material, and a polymer-based material to improve insulation property. The coated thermoelectric element 100 (S40) may be folded at the section of the p-type material 110 and the section of the n-type material 120 (S50).

The folded thermoelectric element 100 (S50) may be disposed between the high temperature portion 10 and the low temperature portion 20 to form the flexible thermoelectric element 100. Meanwhile, a bonding material 140 may be formed (S60), as a heat transfer passage, between the folded thermoelectric element 100, and the high temperature portion 10 and the low temperature portion 20. In other words, the bonding material 140 may be formed of an epoxy and ceramic-based insulating bonding substance. Accordingly it may be possible to improve bonding property between the thermoelectric element 100, and the high temperature portion 10 and the low temperature portion 20, and to simultaneously facilitate a heat transfer.

Further, in the method for manufacturing a flexible thermoelectric element according to the present disclosure, as illustrated in FIG. 5, the flexible thermoelectric element may also be formed by a method of pressurizing the planarized thermoelectric element 100 to integrally include the p-type materials 110 and the n-type materials 120 while being inserted between the insulating fillers 130 formed on the high temperature portion 10 and the low temperature portion 20 to be inserted between the insulating fillers 130. Namely, the insulating fillers 130 are formed to be spaced apart from each other by the predetermined interval on the high temperature portion 10 and the low temperature portion 20, which are the heat source structure.

According to the present disclosure, when the thermoelectric element 100 is disposed between the high temperature portion 10 and the low temperature portion 20, the thermoelectric element 100 may include the plurality of p-type materials 110 and n-type materials 120 formed at the predetermined interval, and may be folded in the sections of the p-type materials 110 and the sections of the n-type materials 120 to form the folding component. The insulating fillers 130 may be coated between the folded p-type materials 110 and the n-type materials 120. Since the module may be configured by folding a flexible thermoelectric element 100 that includes the p-type materials 110 and the n-type materials 120, a separate cutting and alignment of the thermoelectric element 100 may be omitted at portions that contact the high temperature portion 10 and the low temperature portion 20. For example, a thermal contact may be formed by removal of an electrical contact process, to reduce contact resistance, and may improve an output and processing property. Since basic materials of the p-type materials 110 and the n-type materials 120 are similar, damage by a difference of a coefficient of thermal expansion between two materials may be prevented, and it may be possible to increase durability and stability.

As described above, according to the exemplary embodiments of the present disclosure, since the module is configured by folding a flexible thermoelectric element including the p-type materials and the n-type materials, the separate cutting and alignment of the thermoelectric element may be omitted at the portions contacting with the high temperature portion and the low temperature portion. The thermal contact may be formed by removing the electrical contact process, to reduce the contact resistance, and the output and the processing property may be improved. Since the basic materials of the p-type materials and the n-type materials are similar, damage by the difference of the coefficient of thermal expansion between two materials may be prevented, thereby making it possible to increase durability and stability.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A flexible thermoelectric element, comprising:
a thermoelectric element disposed between a high temperature portion and a low temperature portion, wherein
the thermoelectric element includes:
a plurality of p-type materials and a plurality of n-type materials formed at a predetermined interval and folded at sections of the p-type materials and sections of the n-type materials to form folding components; and
an insulating filler coated between the p-type materials and the n-type materials which are folded,
the plurality of p-type materials and the plurality of n-type materials form a band as a whole, which includes a plurality of folding components bent alternately to one side and to another side, and
the insulating filler is coated on the plurality of p-type materials on one side of the band and is coated on the plurality of n-type materials on another side of the band.

2. The flexible thermoelectric element according to claim 1, wherein a bonding material connects the high temperature portion and the thermoelectric element and is configured to allow a heat transfer between the high temperature portion and the folding components of the thermoelectric element.

3. The flexible thermoelectric element according to claim 2, wherein a plurality of bonding materials are formed at each of the folding components of the thermoelectric element.

4. The flexible thermoelectric element according to claim 2, wherein the bonding material is formed of an epoxy or ceramic-based insulating bonding substance.

5. The flexible thermoelectric element according to claim 1, wherein a bonding material connects the low temperature portion and the thermoelectric element and is configured to transfer heat between the low temperature portion and the folding components of the thermoelectric element.

6. The flexible thermoelectric element according to claim 5, wherein a plurality of bonding materials are formed at each of the folding components of the thermoelectric element.

7. The flexible thermoelectric element according to claim 5, wherein the bonding material is formed of an epoxy or ceramic-based insulating bonding substance.

8. The flexible thermoelectric element according to claim 1, wherein the insulating filler is formed of at least one selected from the group consisting of a glass-based material, a ceramic-based material, a rubber-based material, and a polymer-based material.

9. A flexible thermoelectric element, comprising:
a plurality of insulating fillers spaced apart from each other by a predetermined interval on a high temperature portion and a low temperature portion, wherein the thermoelectric element including a plurality of p-type materials and a plurality of n-type materials at a predetermined interval is integrally horizontally formed between the high temperature portion and the low temperature portion, and the thermoelectric element is inserted between the insulating fillers when the high temperature portion and the low temperature portion are pressurized, wherein
the plurality of p-type materials and the plurality of n-type materials form a band as a whole, which includes a plurality of folding components bent alternately to one side and to another side, and
the insulating filler is coated on the plurality of p-type materials on one side of the band and is coated on the plurality of n-type materials on another side of the band.

* * * * *